United States Patent
Naito

(10) Patent No.: US 9,935,115 B2
(45) Date of Patent: Apr. 3, 2018

(54) NONVOLATILE SEMICONDUCTOR STORAGE DEVICE AND METHOD OF MANUFACTURING NONVOLATILE SEMICONDUCTOR STORAGE DEVICE

(71) Applicant: Toshiba Memory Corporation, Minato-ku (JP)

(72) Inventor: Hiroaki Naito, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/065,087

(22) Filed: Mar. 9, 2016

(65) Prior Publication Data

US 2017/0141118 A1 May 18, 2017

Related U.S. Application Data

(60) Provisional application No. 62/256,844, filed on Nov. 18, 2015.

(51) Int. Cl.
*H01L 27/115* (2017.01)
*H01L 21/311* (2006.01)
*H01L 27/11517* (2017.01)
*G11C 16/04* (2006.01)

(52) U.S. Cl.
CPC .... *H01L 27/11517* (2013.01); *G11C 16/0483* (2013.01); *H01L 21/31111* (2013.01); *H01L 21/31116* (2013.01)

(58) Field of Classification Search
CPC ........... H01I 21/31111; H01I 21/31116; H01L 27/11517
See application file for complete search history.

(56) References Cited

U.S. PATENT DOCUMENTS

| 2014/0070304 A1 | 3/2014 | Komiya et al. |
| 2014/0284682 A1 | 9/2014 | Takekida |
| 2016/0148835 A1* | 5/2016 | Shimabukuro ... H01L 27/11556 257/314 |

FOREIGN PATENT DOCUMENTS

| JP | 2014-56899 | 3/2014 |
| JP | 2014-183293 | 9/2014 |
| JP | 2015-15347 | 1/2015 |

* cited by examiner

*Primary Examiner* — Seahvosh Nikmanesh
(74) *Attorney, Agent, or Firm* — Oblon, McClelland, Maier & Neustadt, L.L.P.

(57) ABSTRACT

A nonvolatile semiconductor storage device includes a memory string including a plurality of memory cells connected in series with each other, and a select gate transistor connected to a first end of the memory string. The film thickness of a first hard mask on a select gate electrode of the select gate transistor is greater than the film thickness of a second hard mask film on a control gate electrode of the memory cells. The level of an upper surface of a first side wall insulating film provided on a side surface of the select gate transistor is higher than the level of an upper surface of the first hard mask film. The level of an upper surface of a second side wall insulating film provided on a side surface of the memory cells is higher than the level of an upper surface of the second hard mask film.

13 Claims, 9 Drawing Sheets

NONVOLATILE SEMICONDUCTOR STORAGE DEVICE AND METHOD OF MANUFACTURING NONVOLATILE SEMICONDUCTOR STORAGE DEVICE

CROSS-REFERENCE TO RELATED APPLICATION

This application is based upon and claims the benefit of U.S. provisional Application No. 62/256,844, filed on Nov. 18, 2015, the entire contents of which are incorporated herein by reference.

FIELD

An embodiment relates to a nonvolatile semiconductor storage device and a method of manufacturing the nonvolatile semiconductor storage device.

BACKGROUND

To achieve miniaturization and higher packaging density of memory cells of a nonvolatile semiconductor storage device, such as a NAND flash memory, the gate length is being reduced. To reduce the difficulty of processing, a flat cell structure is being adopted as an alternative to the conventional rocket cell structure. The flat cell structure adopts a silicon nitride film (SiN) instead of the conventional oxide film as hard mask films, from the viewpoint of etching selectivity in gate processing.

In the flat cell structure in which the silicon nitride film (SiN film) is used as hard mask films, however, the hard mask film on the select gate electrode is thicker than the hard mask film on the word line (control gate electrode) because of the difference in etching rate between the pattern of thicker lines and the pattern of thinner lines.

The hard mask film on the select gate electrode serves also as a stopper film in contact formation. Therefore, the hard mask film needs to have a certain thickness.

If the hard mask film on the select gate electrode is too thick, however, there is a problem that an opening for a contact to be connected to the select gate electrode is not satisfactorily formed when the contact to be connected to the select gate electrode is formed at the same time as a contact to be connected to the silicon substrate.

DETAILED DESCRIPTION

A nonvolatile semiconductor storage device according to an embodiment includes a memory string including a plurality of memory cells connected in series with each other. The nonvolatile semiconductor storage device includes a select gate transistor connected to a first end of the memory string.

The film thickness of a first hard mask on a select gate electrode of the select gate transistor is greater than the film thickness of a second hard mask film on a control gate electrode of the memory cells.

The level of an upper surface of a first side wall insulating film provided on a side surface of the select gate transistor is higher than the level of an upper surface of the first hard mask film.

The level of an upper surface of a second side wall insulating film provided on a side surface of the memory cells is higher than the level of an upper surface of the second hard mask film.

In the following, an embodiment will be described with reference to the drawings.

First Embodiment

Figure 1:
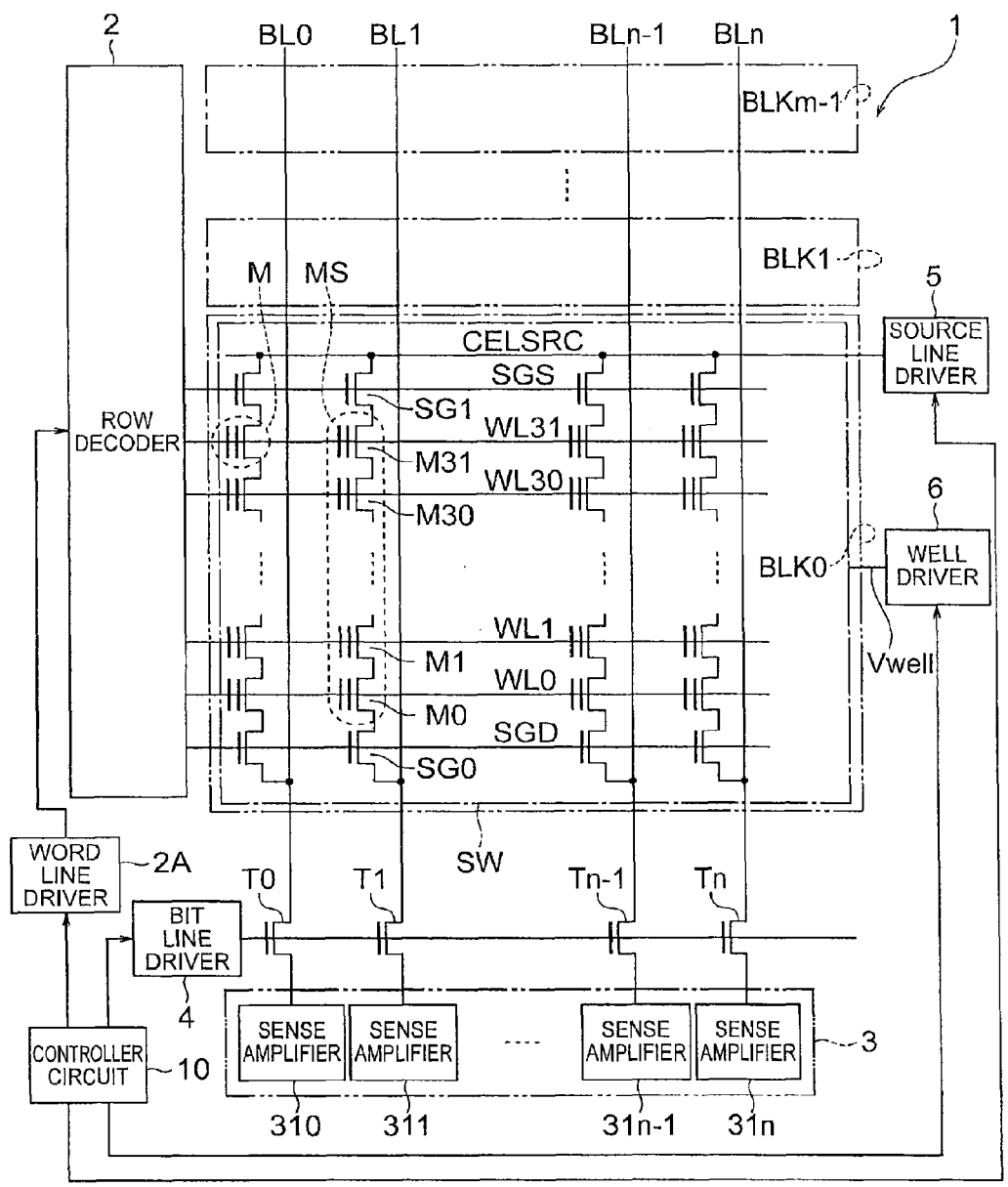
FIG. 1 is a block diagram showing an example of a configuration of a NAND flash memory 100 according to a first embodiment, which is an aspect of the present invention.

FIG. 1 is a block diagram showing an example of a configuration of a NAND flash memory 100 according to a first embodiment, which is an aspect of the present invention.

As shown in FIG. 1, the NAND flash memory 100 (nonvolatile semiconductor storage device) 100 includes a memory cell array 1, a row decoder 2, a word line driver 2A, a sense amplifier circuit 3, a bit line driver 4, a source line driver 5, a well driver 6, a gate driver 20, a clamp transistors "T0" to "Tn" (where "n" denotes a positive integer), a discharge transistors "X0" to "Xn", and a controller circuit 10.

The memory cell array 1 includes a plurality of bit lines "BL0" to "BLn", a plurality of word lines "WL0" to "WL31", and a source line "CELSRC". The memory cell array 1 is composed of a plurality of NAND cell blocks "BLK0" to "BLKm−1" (where "m" denotes a positive integer), each of which includes a matrix arrangement of electrically data rewritable memory cells "M" ("M0" to "M31"), which are formed by EEPROM cells, for example.

A NAND cell unit is composed of a column of a plurality of memory cells (memory cell transistors) "M" ("M0" to "M31") that are connected in series with each other in such a manner that adjacent cells share their source and drain, and select gate transistors "SG0" and "SG1" that are connected to the opposite ends of the series connection of the memory cells.

The memory cell array 1 is composed by a matrix arrangement of the NAND cell units. The NAND cell block "BLK0" to "BLKm−1" described above is composed of a row of NAND cell units. Gates (select gate electrodes) of the select gate transistors "SG0" arranged in the same row are connected to the same select gate line, and gates (control gate electrodes) of the memory cells "M" arranged in the same row are connected to the same control gate line.

In the example shown in FIG. 1, the memory cell array 1 includes an array of memory strings "MS", each of which is a series connection of 32 electrically data rewritable memory cells "M0" to "M31". Note that the number of memory cells "M" in one memory string "MS" is not limited to 32 but can be 64 or 128, for example.

A drain-side select gate transistor "SG0" and a source-side select gate transistor "SG1", which become conductive when the memory string "MS" is selected, are connected to the opposite ends of the memory string "MS". In the example shown in FIG. 1, the NAND cell unit described above is composed of the 32 memory cells "M0" to "M31" and the two select gate transistors "SG0" and "SG1".

That is, each NAND cell unit is connected to the bit line "BL" ("BL0" to "BLn") at one end of the drain-side select gate transistor "SG0" and to the source line "CELSRC" at one end of the source-side select gate transistor "SG1".

The control gate electrodes of the memory cells "M0" to "M31" in the NAND cell unit are connected to different word lines "WL0" to "WL31", respectively. The select gate electrodes of the select gate transistors "SG0" and "SG1" are connected to select gate lines "SGD" and "SGS" that are parallel with the word lines "WL0" to "WL31".

The word lines WL ("WL0" to "WL31") and the select gate lines "SGD" and "SGS" are selectively driven by an output of the word line driver 2A and the row decoder 2.

The bit lines "BL0" to "BLn" are connected to sense amplifiers 310 to 31n in the sense amplifier circuit 3, respectively. In a read operation, the bit lines "BL0" to "BLn" are charged to a predetermined voltage by a pre-charge circuit (not shown) in the sense amplifiers 310 to 31n. The clamp transistors "T0" to "Tn" are connected between the bit lines "BL" and the sense amplifiers 310 to 31n, and the gate voltages of the clamp transistors "T0" to "Tn" are controlled by the bit line driver 4.

In this example, the bit lines "BL0" to "BLn" are shown as being connected to the sense amplifiers 310 to 31n in a one-to-one relationship. In this case, the memory cells "M" selected by one word line constitute one page of memory cells that are to be written/read at the same time. Alternatively, for example, an even-numbered bit line and an odd-numbered bit line adjacent to each other may share one sense amplifier. In that case, half of the memory cells selected by one word line constitute a unit (one page) of simultaneous writing/reading.

A set of NAND cell units that share one word line constitutes a block that is a unit of data erasure. In the example shown in FIG. 1, a plurality of blocks "BLK0", "BLK1", "BLKm−1" are arranged in the direction of the bit lines "BL" ("BL0" to "BLn").

As shown in FIG. 1, the sense amplifier circuit 3 that controls the voltage of the bit lines and the row decoder 2 that controls the voltage of the word line are connected to the memory cell array 1. In a data erasure operation, a block is selected by the row decoder 2, the remaining blocks are left unselected. In accordance with the output of the word line driver 2A controlled by the controller circuit 10, the row decoder 2 applies a voltage required for reading, writing or erasure to the word line of the memory cell array 1.

The sense amplifier 3 includes the sense amplifiers 310 to 31n.

The sense amplifiers 310 to 31n sense-amplify the voltage of the bit lines "BL0" to "BLn" in the memory cell array 1. The sense amplifiers 310 to 31n include a data latch circuit that latches data to be written.

The sense amplifier circuit 3 reads data from the memory cell "M" in the memory cell array 1 via the bit line "BL", detects the state of the memory cell "M" via the bit line "BL", or writes data to the memory cell "M" by applying a write control voltage to the memory cell "M" via the bit line "BL".

Furthermore, a column decoder (not shown) and a data input/output buffer (not shown) are connected to the sense amplifier 3. The column decoder selects from among the data latch circuits in the sense amplifier circuit 3. The data of the memory cell transistor is read from the selected data latch circuit and output to the outside via the data input/output buffer (not shown).

Externally input data to be written is stored in the data latch circuit selected by the column decoder via the data input/output buffer (not shown).

As described above, the source line driver 5 is connected to the memory cell array 1. The source line driver 5 is configured to control the voltage of the source line "CELSRC".

As described above, the well driver 6 is connected to the memory cell array 1. The well driver 6 is configured to control the voltage of a semiconductor substrate (well "SW") on which the memory cells "M" are formed.

The controller circuit 10 performs a control operation in response to a control signal (a command latch enable signal, an address latch enable signal, a ready/busy signal or the like) and a command that are externally input. That is, the controller circuit 10 produces a desired voltage and supplies the voltage to each part of the memory cell array 1 in response to the control signal and the command, when programming, verifying, reading or erasing data.

That is, the controller circuit 10 controls the gate driver 20, the word line driver 2A, the bit line driver 4, the source line driver 5 and the well driver 6, thereby controlling the voltage applied to the gate line, the word lines "WL0" to "WLn", the bit lines "BL0" to "BLn", the source line "CELSRC" and the well "SW".

Figure 2:
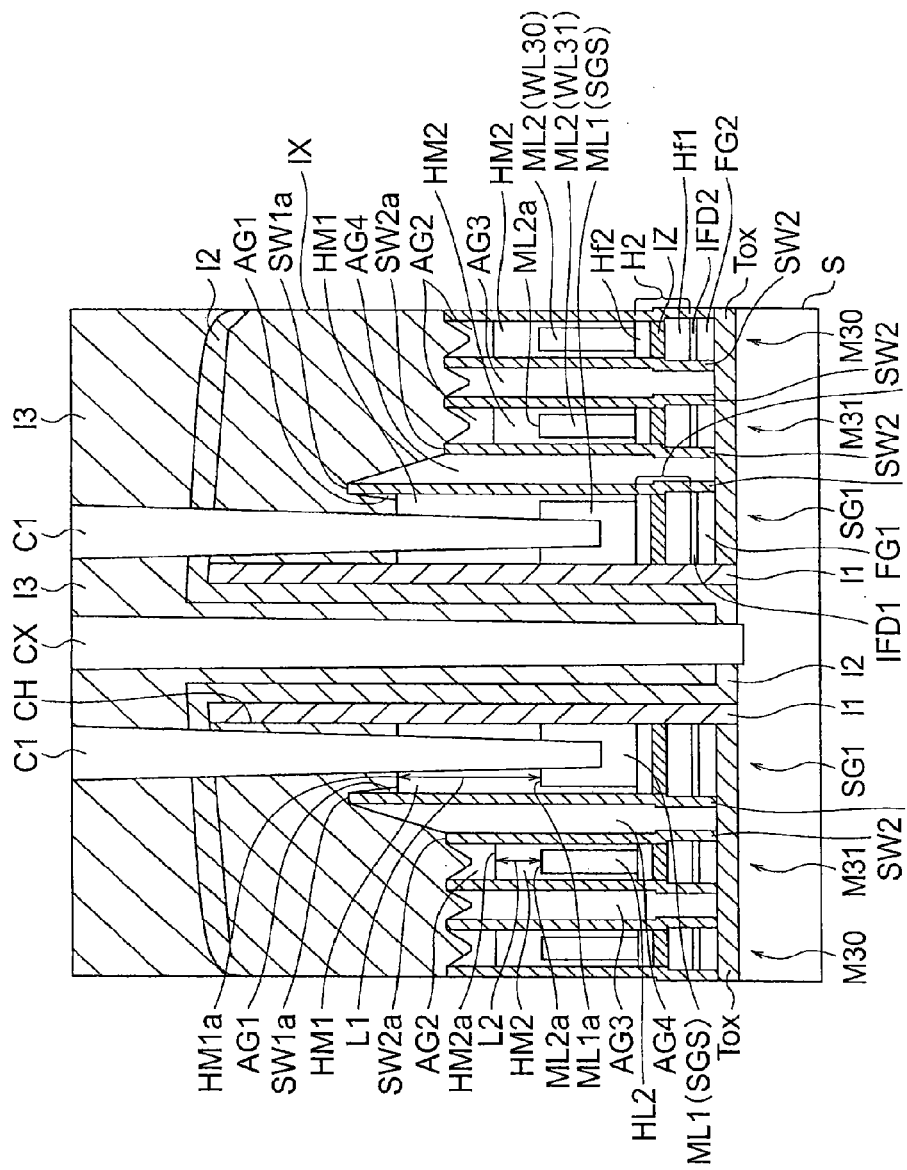
FIG. 2 is a schematic cross-sectional view showing a cross-sectional structure of the memory cell array 1 of the NAND flash memory 100 shown in FIG. 1 taken along the bit line "BL1"

FIG. 2 is a schematic cross-sectional view showing a cross-sectional structure of the memory cell array 1 of the NAND flash memory 100 shown in FIG. 1 taken along the bit line "BL1". Although FIG. 2 shows only the select gate transistor "SG1" and the memory cells "M30" and "M31"

and the vicinity thereof, the select gate transistor "SG0" and the memory cells "M0" to "M29" have the same configuration.

As shown in FIG. 2, a tunnel insulating film (gate insulating film) "Tox" is formed on a semiconductor substrate (silicon substrate) "S". The tunnel insulating film "Tox" is a silicon oxide film, for example, and is formed on an upper surface of the semiconductor substrate "S" in a region where the memory cells "M30" and "M31" and the select gate transistor "SG1" are formed.

As shown in FIG. 2, the select gate transistor "SG1" includes the tunnel insulating film "Tox" formed on the semiconductor substrate "S", a first floating gate electrode (charge storage layer) "FG1" provided on the tunnel insulating film "Tox", a first inter floating-gate dielectric (IFD) film "IFD1" provided on the first floating gate electrode "FG1", a first high dielectric constant insulating film "H1" provided on the first IFD film "IFD1", a control gate electrode "ML1" ("SGS") provided on the first high dielectric constant insulating film "H1", and a first hard mask film (such as a SiN film) "HM1" provided on the control gate electrode "ML1", for example. A contact wire "C1" is connected to the control gate electrode "ML1".

In a contact hole 10 formed between adjacent select gate transistors "SG1", a contact wire "CX" connected to the source line "CELSRC" is provided with an insulating film (such as a $SiO_2$ film) "I1" and a SiN film "I2" interposed between the contact wire "CX" and the adjacent select gate transistor "SG1".

As shown in FIG. 2, the memory cells "M30" and "M31" include the tunnel insulating film "Tox" formed on the semiconductor substrate "S", a second floating gate electrode (charge storage layer) "FG2" provided on the tunnel insulating film "Tox", a second IFD film "IFD2" provided on the second floating gate electrode "FG2", a second high dielectric constant insulating film "H2" provided on the second IFD film "IFD2", a control gate electrode "ML2" ("WL30", "WL31") provided on the second high dielectric constant insulating film "H2", and a second hard mask film (such as a SiN film) "HM2" provided on the select gate electrode "ML2", for example.

The first and second floating gate electrodes "FG1" and "FG2" are polysilicon films, for example.

As shown in FIG. 2, the first and second high dielectric constant insulating films "H1" and "H2" include a first hafnium-added silicon oxide film (HfSiOx) "Hf1" provided on the first and second floating gate electrode "FG1" and "FG2", a silicon oxide film "IZ" provided on the first hafnium-added silicon oxide film "Hf1", and a second hafnium-added silicon oxide film (HfSiOx) "Hf2" provided on the silicon oxide film "IZ", for example.

Furthermore, an interlayer insulating film "IX" is provided on the memory cells "M30" and "M31" and the select gate transistor "SG1".

On the first hard mask "HM1", a first air gap "AG1", which is defined by a lower part of the interlayer insulating film "IX", an upper part of a first side wall insulating film "SW1" of the select gate transistor "SG1" and a part of the upper surface of the first had mask film "HM1", is provided. An upper surface "HM1a" of the first hard mask film "HM1" is in contact with the lower part of the interlayer insulating film "IX" at a central part thereof. That is, there is not the first side wall insulating film "SW1" in the central part of the upper surface of the first hard mask film "HM1".

The first air gap "AG1" on the first hard mask film "HM1" improves the withstand voltage of the select gate transistor "SG1".

On the second hard mask film "HM2", a second air gap "AG2", which is defined by the lower part of the interlayer insulating film "IX", an upper part of the second side wall insulating film "SW2" of the memory cell "M30" or "M31" and an upper surface of the second hard mask film "HM2", is provided.

The second air gap "AG2" on the second hard mask film "HM2" improves the withstand voltage of the memory cell "M30" or "M31".

Between the adjacent two memory cells "M30" and "M31", a third air gap "AG3", which is defined by the lower part of the interlayer insulating film "IX" and the second side wall insulating films "SW2" of the adjacent two memory cells "M30" and "M31", is provided.

Between the memory cell "M31" and the adjacent select gate transistor "SG1", a fourth air gap "AG4", which is defined by the lower part of the interlayer insulating film "IX", the second side wall insulating film "SW2" of the memory cell "M31" and the first side wall insulating film "SW1" of the select gate transistor "SG1", is provided.

The level of an upper surface "ML1a" of the select gate electrode "ML1" is the same as the level of an upper surface "ML2a" of the control gate electrode "ML2". The level of an upper surface "HM1a" of the first hard mask film "HM1" is higher than the level of an upper surface "HM2a" of the second hard mask film "HM2". The width (line width) of the select gate electrode "ML1" in the direction of arrangement of the plurality of memory cells "M30" to "M31" and the select gate transistor "SG1" (the direction along the bit line "BL1") is greater than the width (line width) of the control gate electrode "ML2".

A film thickness "L1" of the first hard mask film "HM1" on the select gate electrode "ML1" ("SGS") of the select gate transistor "SG1" is greater than a film thickness "L2" of the second hard mask films "HM2" on the control gate electrodes "ML2" ("WL30", "WL31") of the memory cells "M30" to "M31".

In addition, the film thickness of a hard mask film provided on a leader wire (which has a greater width than the control gate electrode "ML2") extending from the control gate electrode "ML2" ("WL30", "WL31") of the memory cell "M30" or "M31" is greater than the film thickness of the second hard mask film "HM2". The layered structure of the leader wire and the hard mask film provided thereon is the same as the layered structure of the control gate electrode "ML2" and the second hard mask film "HM2".

The level of an upper surface "SW1a" of the first side wall insulating film "SW1" provided on the side surface of the select gate transistor "SG1" is higher than the upper surface "HM1a" of the first hard mask film "HM1". The level of an upper surface "SW2a" of the second side wall insulating film "SW2" provided on the side surface of the memory cells "M30" or "M31" is higher than the level of an upper surface "HM2a" of the second hard mask film "HM2". The level of the upper surface "SW1a" of the first side wall insulating film "SW1" is higher than the level of the upper surface "SW2a" of the second side wall insulating film "SW2".

With such a configuration, the level of each air gap is higher than the level of the select gate electrode and the control gate electrode, so that the withstand voltage is improved.

Next, an example of a method of manufacturing the NAND flash memory 100 having the configuration and functionality described above will be described. Although the description of this embodiment will be focused on the characteristic parts thereof, any common step can be added between steps of the method, or any step of the method can be omitted as required. The order of steps can be changed as required as far as it is practically feasible.

FIGS. 3 to 15 are cross-sectional views showing cross sections of the NAND flash memory 100 shown in FIGS. 1 and 2 in different steps of the manufacturing method. The cross-sectional structures schematically shown in FIGS. 3 to 15 are taken along the bit line "BL1".

Figure 3:
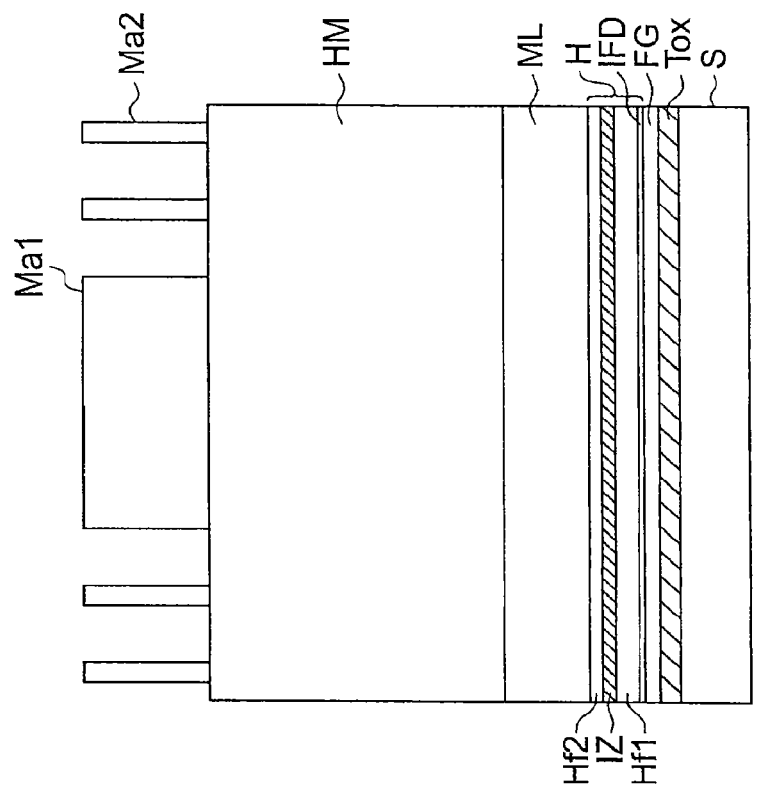
FIG. 3 is a cross-sectional view showing cross section of the NAND flash memory 100 shown in FIGS. 1 and 2 in different steps of the manufacturing method.

First, as shown in FIG. 3, the semiconductor substrate (silicon substrate)"S" is subjected to ion implantation for well region formation, and the tunnel insulating film (tunnel insulating film) "Tox" is then formed on the silicon substrate "S". On the tunnel insulating film "Tox", a first electrode film (such as a polysilicon film) "FG", which is to form the floating gate electrode, is then formed.

A metal layer of Ru or the like (not shown) is then formed on the first electrode film "FG", and an inter floating-gate dielectric (IFD) film (such as a SiN film) "IFD" is then formed on the metal layer. For example, the IFD film "IFD" is formed by low pressure-chemical vapor deposition (LP-CVD) or atomic layer deposition (ALD).

On the IFD film "IFD", a high dielectric constant insulating film "H" that primarily contains hafnium, for example, is then formed. A second electrode film "ML" is then formed on the high dielectric constant insulating film "H". A hard mask film (such as a SiN film) "HM" is then formed on the second electrode film "ML". The second electrode film "ML" contains a metal, such as TiN, TaN, W, Ni or Co.

After that, as shown in FIG. 3, mask film (such as an amorphous silicon film) "Ma1" and "Ma2" are selectively formed on the high dielectric constant insulating film "H".

Figure 4:
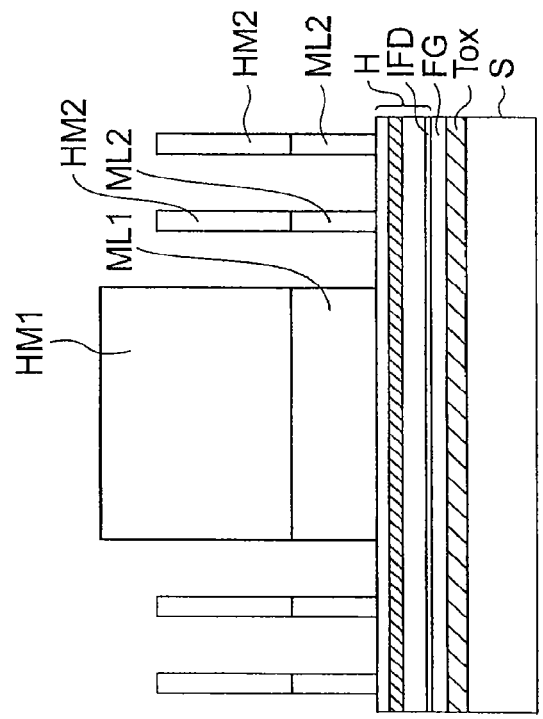
FIG. 4 is a cross-sectional view showing cross section of the NAND flash memory 100 shown in FIGS. 1 and 2 in different steps of the manufacturing method.

After that, as shown in FIG. 4, using the mask films "Ma1" and "Ma2" as masks, the hard mask film "HM" and the second electrode film "ML" are selectively removed by anisotropic etching (such as reactive ion etching (RIE)). In this way, the first hard mask film "HM1" formed by the hard mask film (SiN film) "HM" and the select gate electrode "ML1" ("SGS") formed by the second electrode film "ML" on the first hard mask film "HM1" of the select gate transistor "SG1" are formed. In addition, the second hard mask "HM2" formed by the hard mask film "HM" and the control gate electrode "ML2" ("WL30", "WL31") formed by the second electrode film "ML" on the second hard mask film "HM2" of the memory cells "M30" and "M31" are formed.

In the direction of arrangement of the memory cells "M30" and "M31" and the select gate transistor "SG1", the width (line width) of the select gate electrode "ML1" is greater than the width (line width) of the control gate electrode "ML2".

As a result, the second hard mask film "HM2" on the control gate electrode "ML2" is etched to a greater degree than the first hard mask film "HM1" on the select gate electrode "ML1" due to the loading effect.

Figure 5:
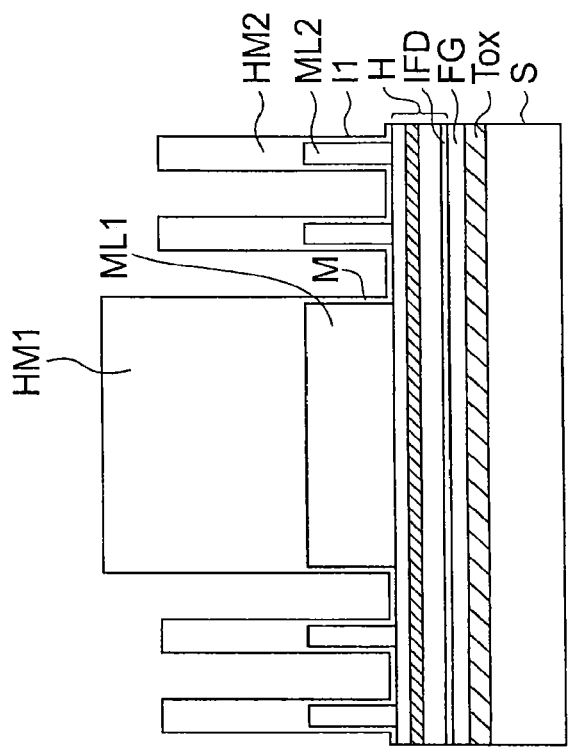
FIG. 5 is a cross-sectional view showing cross section of the NAND flash memory 100 shown in FIGS. 1 and 2 in different steps of the manufacturing method.

As shown in FIG. 5, the first insulating film (such as a SiN film) is then formed to cover the side surface of the select gate electrode "ML1" and the side surface of the control gate electrode "ML2".

Figure 6:
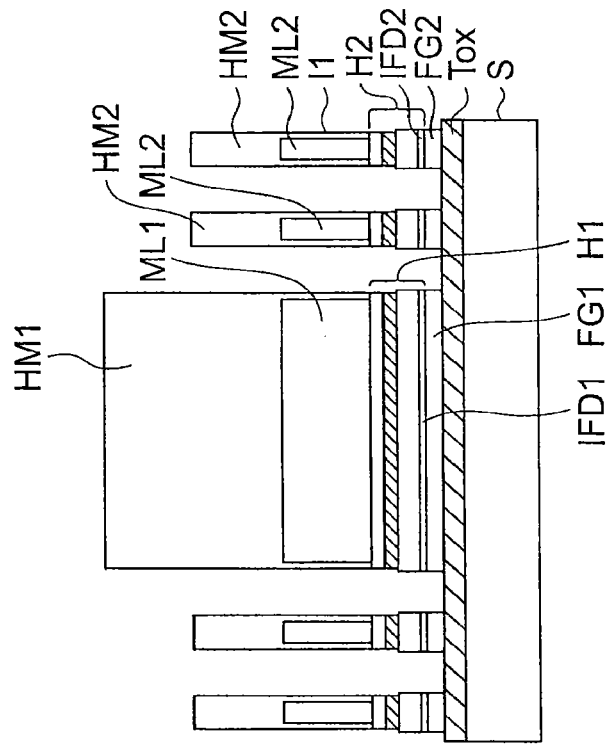
FIG. 6 is a cross-sectional view showing cross section of the NAND flash memory 100 shown in FIGS. 1 and 2 in different steps of the manufacturing method.

As shown in FIG. 6, using the first hard mask film "HM1" and the second hard mask film "HM2" as masks, the IFD film "IFD" and the first electrode film "FG" are then selectively removed by anisotropic etching (such as RIE).

In this way, the first floating gate electrode "FG1" and the first IFD film "IFD1" on the first floating gate electrode "FG1" of the select gate transistor "SG1" are formed. Besides, the second floating gate electrode "FG2" and the second IFD film "IFD2" on the second floating gate electrode "FG2" of the memory cells "M30" and "M31" are formed. That is, the layered structures of the memory cells and the layered structure of the select gate transistor are separated from each other.

In this step, the second hard mask film "HM2" on the control gate electrode "ML2" is also etched to a greater degree than the first hard mask film "HM1" on the select gate electrode "ML1" due to the loading effect. That is, the film thickness of the first hard mask film "HM1" (60 nm, for example) is greater than the film thickness (30 nm, for example) of the second hard mask film "HM2".

Figure 7:
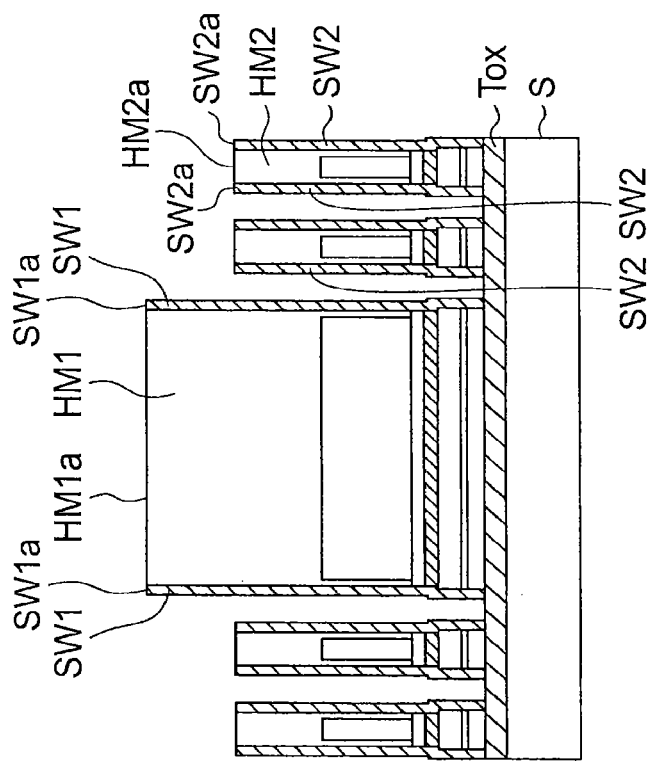
FIG. 7 is a cross-sectional view showing cross section of the NAND flash memory 100 shown in FIGS. 1 and 2 in different steps of the manufacturing method.

As shown in FIG. 7, an oxide film (such as a $SiO_2$ film) is then deposited by chemical vapor deposition (CVD), for example. The first side wall insulating film "SW1" is thus formed to cover the first floating gate electrode "FG1", the first IFD film "IFD1" on the first floating gate electrode "FG1", the select gate electrode "ML1" on the first IFD film and the first hard mask film "HM1" on the select gate electrode "ML1" of the select gate transistor "SG1". At the same time, the second side wall insulating film "SW2" is also formed to cover the second floating gate electrode "FG2", the second IFD film "IFD2" on the second floating gate electrode "FG2", the control gate electrode "ML2" on the second IFD film "IFD2" and the second hard mask film "HM2" on the control gate electrode "ML2" of the memory cells "M30" and "M31".

Figure 8:
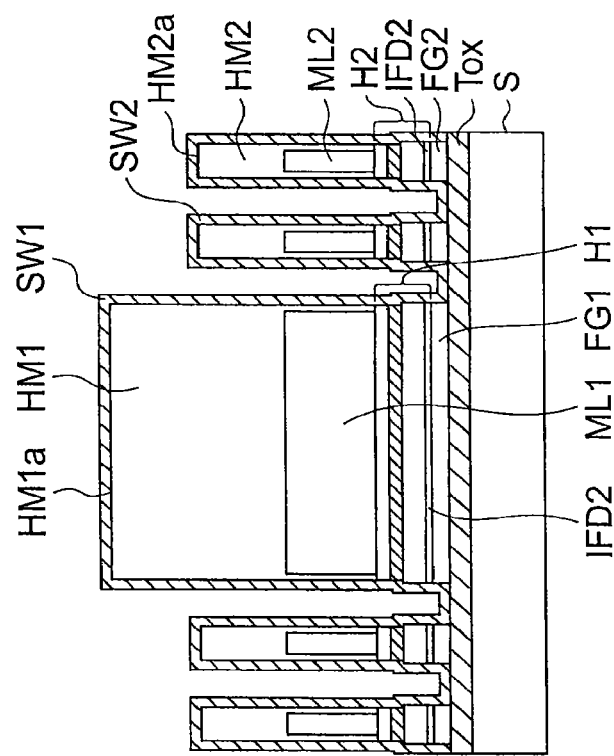
FIG. 8 is a cross-sectional view showing cross section of the NAND flash memory 100 shown in FIGS. 1 and 2 in different steps of the manufacturing method.

As shown in FIG. 8, the first side wall insulating film "SW1" on the upper surface of the first hard mask film "HM1" and the second side wall insulating film "SW2" on the upper surface of the second hard mask film "HM2" are then selectively removed by RIE, for example.

Figure 9:
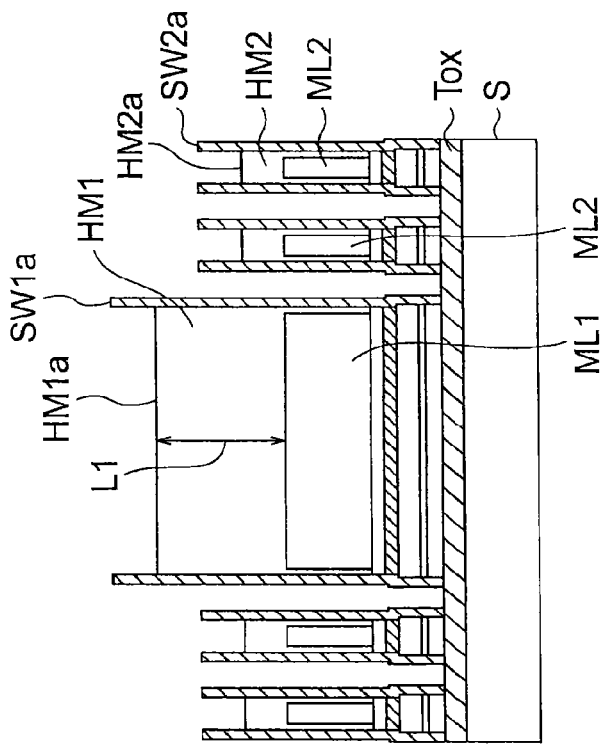
FIG. 9 is a cross-sectional view showing cross section of the NAND flash memory 100 shown in FIGS. 1 and 2 in different steps of the manufacturing method.

As shown in FIG. 9, the upper surface "HM1a" of the first hard mask film "HM1" and the upper surface "HM2" of the second hard mask film "HM2" are partially removed by wet etching using hot phosphoric acid or chemical dry etching. In this way, the film thickness of the first and second hard mask films "HM1" and "HM2" (SiN film) can be selectively adjusted to be a film thickness required for contact processing. In this step, the film thickness "L1" (45 nm, for example) of the first hard mask film "HM1" on the select gate electrode "ML1" is greater than the film thickness "L2" (15 nm, for example) of the second hard mask film "HM2" on the control gate electrode "ML2".

Since the film thickness of the first and second hard mask films "HM1" and "HM2" (SiN film) can be adjusted as described above, a processing margin for formation of the contact "C1" connected to the select gate electrode "ML1" described later can be increased. In addition, by appropriately adjusting the film thickness of the first and second hard mask films "HM1" and "HM2" (SiN film), which have a high capacitance value, the parasitic capacitance can be reduced, and quick operation of the transistors can be achieved.

Figure 10:
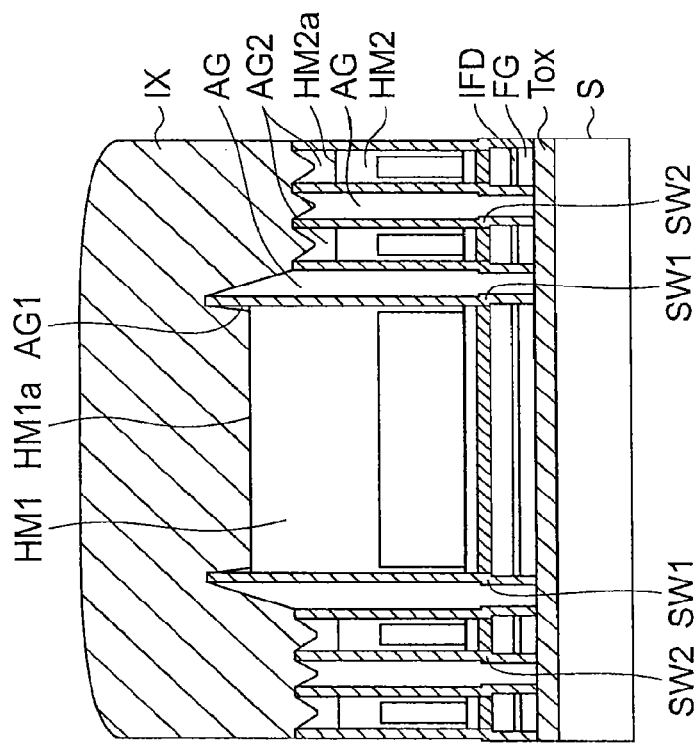
FIG. 10 is a cross-sectional view showing cross section of the NAND flash memory 100 shown in FIGS. 1 and 2 in different steps of the manufacturing method.

As shown in FIG. 10, the interlayer insulating film "IX" is then formed by CVD over the first hard mask film "HM1", the first side wall insulating film "SW1", the second hard mask film "HM2" and the second side wall insulating film "SW2".

As a result, the first air gap "AG1", which is defined by a lower part of the interlayer insulating film "IX", an upper part of the first side wall insulating film "SW1" of the select gate transistor "SG1" and a part of the upper surface "HM1a" of the first had mask film "HM1", is formed on the first hard mask "HM1". In addition, the second air gap "AG2", which is defined by the lower part of the interlayer insulating film "IX", an upper part of the second side wall insulating film "SW2" of the memory cell "M30" or "M31"

and an upper surface of the second hard mask film "HM2", is formed on the second hard mask film "HM2".

In addition, the third air gap "AG3", which is defined by the lower part of the interlayer insulating film "IX" and the adjacent two second side wall insulating films "SW2", is formed.

In addition, the fourth air gap "AG4", which is defined by the lower part of the interlayer insulating film "IX", the second side wall insulating film "SW2" and the first side wall insulating film "SW1", is formed.

Figure 11:
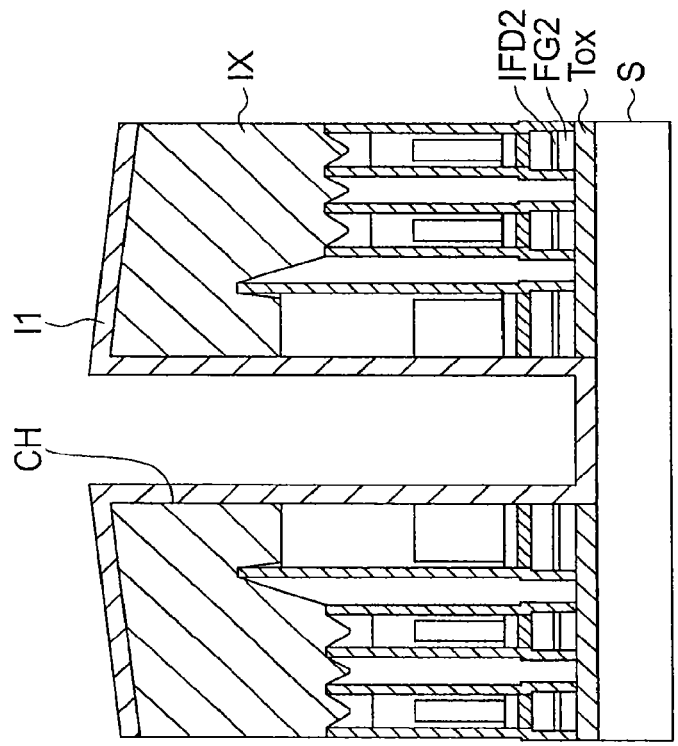
FIG. 11 is a cross-sectional view showing cross section of the NAND flash memory 100 shown in FIGS. 1 and 2 in different steps of the manufacturing method.

As shown in FIG. 11, the contact hole 10 that reaches to the tunnel insulating film "Tox" is then formed by etching the first hard mask film "HM1", the select gate electrode "ML1", the first high dielectric constant insulating film "H1", the first IFD film "IFD" and the first floating gate electrode "FG1".

Figure 12:
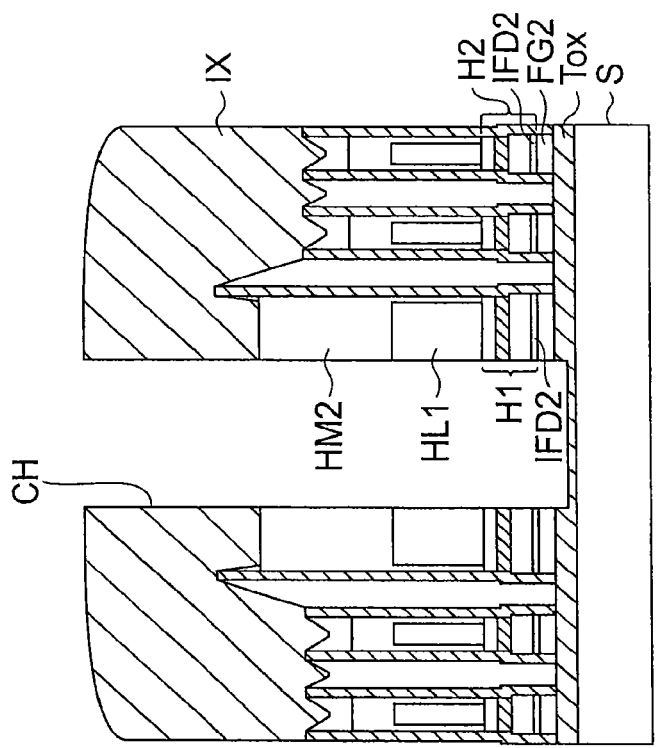
FIG. 12 is a cross-sectional view showing cross section of the NAND flash memory 100 shown in FIGS. 1 and 2 in different steps of the manufacturing method.

As shown in FIG. 12, the insulating film (such as a SiO$_2$ film) "I1" is then deposited in the contact hole 10 by CVD.

Figure 13:
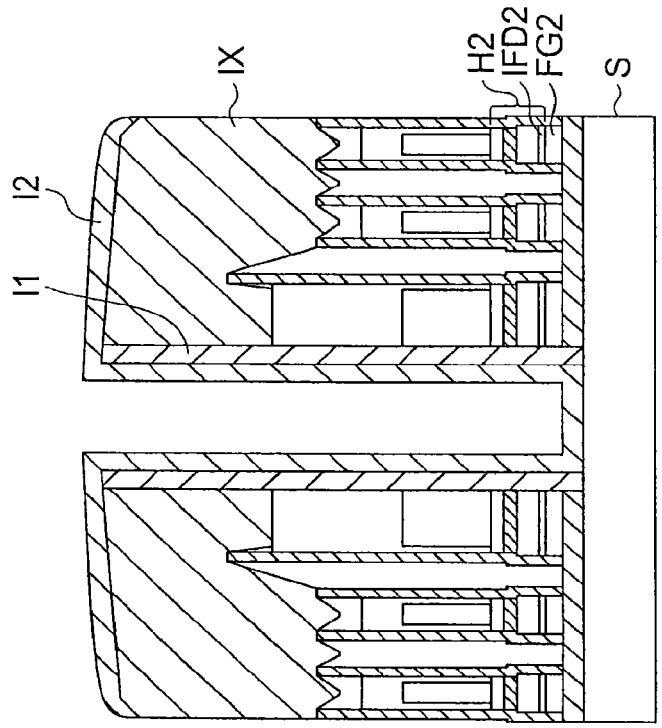
FIG. 13 is a cross-sectional view showing cross section of the NAND flash memory 100 shown in FIGS. 1 and 2 in different steps of the manufacturing method.

As shown in FIG. 13, the insulating film "I1" and the tunnel insulating film "Tox" on the bottom of the contact hole 10 are then etched back to expose the upper surface of the semiconductor substrate "S".

Figure 14:
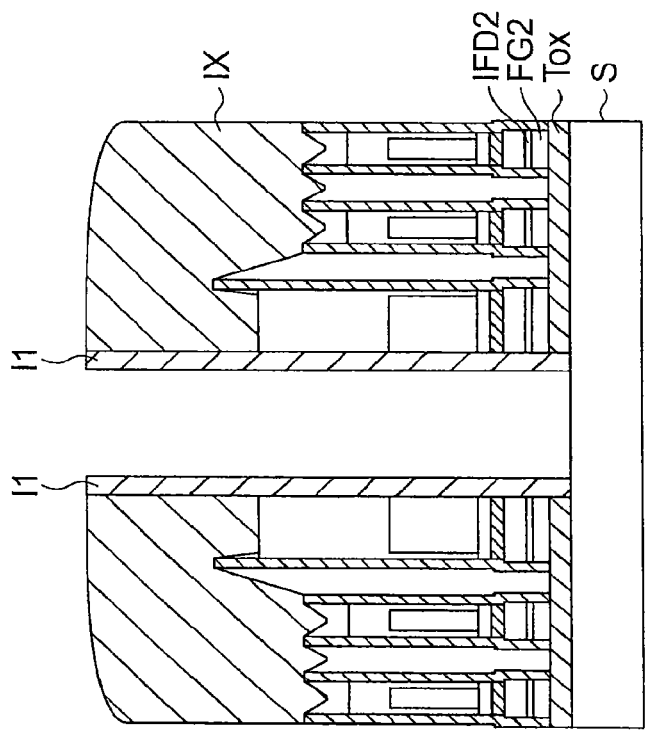
FIG. 14 is a cross-sectional view showing cross section of the NAND flash memory 100 shown in FIGS. 1 and 2 in different steps of the manufacturing method.
Figure 15:
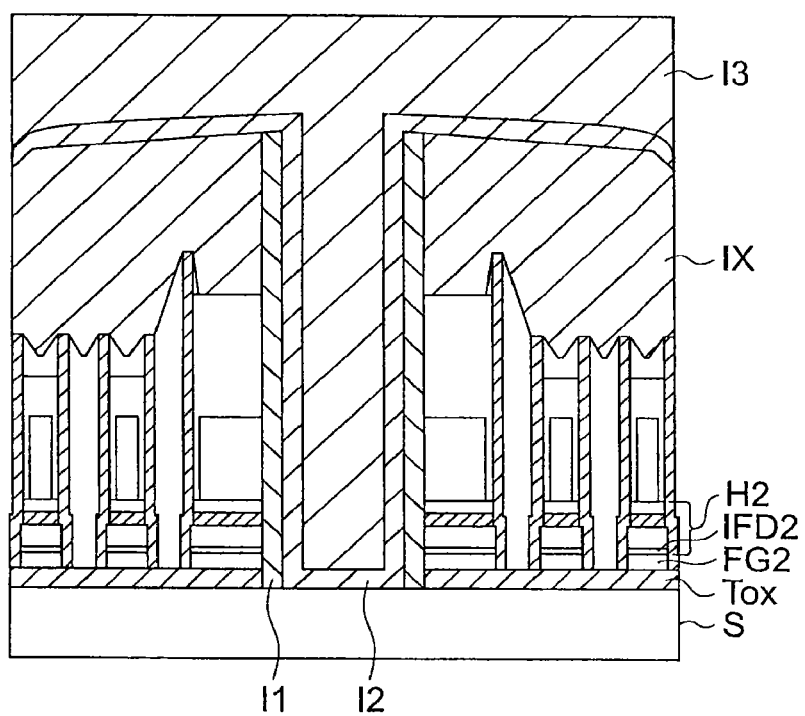
FIG. 15 is a cross-sectional view showing cross section of the NAND flash memory 100 shown in FIGS. 1 and 2 in different steps of the manufacturing method.

The SiN film "I2" is then deposited by CVD, for example, as shown in FIG. 14, and an interlayer insulating film "I3" is then deposited as shown in FIG. 15.

Following the step shown in FIG. 15, a wiring step is performed to form the contact wires "C1" and "CX", the source line "CELSRC", the bit lines "BL" and the like. In this way, the NAND flash memory 100 shown in FIGS. 1 and 2 described above is completed.

As described above, in the method of manufacturing the NAND flash memory 100, the film thickness of the hard mask film (SiN film) serving as a stopper film in contact formation can be adjusted as desired, so that the processing margin for contact formation can be increased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
   a memory string including a plurality of memory cells connected in series with each other; and
   a select gate transistor connected to a first end of the memory string,
   wherein a film thickness of a first hard mask on a select gate electrode of the select gate transistor is greater than a film thickness of a second hard mask film on a control gate electrode of the memory cells,
   a first level of an upper surface of a first side wall insulating film provided on a side surface of the select gate transistor is higher than a second level of an upper surface of the first hard mask film,
   a third level of an upper surface of a second side wall insulating film provided on a side surface of the memory cells is higher than a forth level of an upper surface of the second hard mask film,
   the first level of the upper surface of the first side wall insulating film is higher than the third level of the upper surface of the second side wall insulating film, and
   a fifth level of an upper surface of the select gate electrode is the same as a sixth level of an upper surface of the control gate electrode.

2. The nonvolatile semiconductor storage device according to claim 1, wherein the first hard mask film and the second hard mask film are SiN films.

3. The nonvolatile semiconductor storage device according to claim 1, wherein the width of the select gate electrode in the direction of arrangement of the plurality of memory cells and the select gate transistor is greater than the width of the control gate electrode.

4. The nonvolatile semiconductor storage device according to claim 1, further comprising:
   an interlayer insulating film provided on the memory cells and the select gate transistor,
   wherein a first air gap is provided on the first hard mask film, the first air gap being defined by a lower part of the interlayer insulating film, an upper part of the first side wall insulating film of the select gate transistor and a part of the upper surface of the first hard mask film.

5. The nonvolatile semiconductor storage device according to claim 4, wherein a central part of the upper surface of the first hard mask film is in contact with the lower part of the interlayer insulating film.

6. The nonvolatile semiconductor storage device according to claim 5, wherein the first side wall insulating film does not exist in the central part of the upper surface of the first hard mask film.

7. The nonvolatile semiconductor storage device according to claim 1, further comprising:
   an interlayer insulating film provided on the memory cells and the select gate transistor,
   wherein a second air gap is provided on the second hard mask film, the second air gap being defined by a lower part of the interlayer insulating film, an upper part of the second side wall insulating film of the memory cell and an upper surface of the second hard mask film.

8. The nonvolatile semiconductor storage device according to claim 1, wherein a third air gap is provided between adjacent two of the memory cells, the third air gap being defined by a lower part of the interlayer insulating film and the second side wall insulating films of the adjacent two memory cells.

9. The nonvolatile semiconductor storage device according to claim 1, wherein a fourth air gap is provided between the select gate transistor and the memory cell adjacent to the select gate transistor, the fourth air gap being defined by a lower part of the interlayer insulating film, the second side wall insulating film of the memory cell and the first side wall insulating film of the select gate transistor.

10. The nonvolatile semiconductor storage device according to claim 1, wherein the film thickness of a hard mask film provided on a leader wire extending from the control gate electrode of the memory cell is greater than the film thickness of the first hard mask film.

11. The nonvolatile semiconductor storage device according to claim 1, wherein the memory cells include:
   a tunnel insulating film provided on a semiconductor substrate;
   a floating gate electrode provided on the tunnel insulating film;
   a second inter floating-gate dielectric (IFD) film provided on the floating gate electrode;

a high dielectric constant insulating film provided on the second IFD film; and the control gate electrode provided on the high dielectric constant insulating film.

12. The nonvolatile semiconductor storage device according to claim 11, wherein the high dielectric constant insulating film includes:

a first hafnium-added silicon oxide film provided on the floating gate electrode;

a silicon oxide film provided on the first hafnium-added silicon oxide film; and a second hafnium-added silicon oxide film provided on the silicon oxide film.

13. The nonvolatile semiconductor storage device according to claim 1, wherein the nonvolatile semiconductor storage device is a NAND flash memory.

* * * * *